United States Patent
Kim

(10) Patent No.: US 10,403,226 B2
(45) Date of Patent: Sep. 3, 2019

(54) SOURCE DRIVER AND DISPLAY DEVICE INCLUDING THE SAME

(71) Applicant: DB HiTek Co., Ltd., Bucheon-si (KR)

(72) Inventor: Yoo Sung Kim, Gyeonggi-do (KR)

(73) Assignee: DB HiTek Co., Ltd., Bucheon-Si (KR)

( * ) Notice: Subject to any disclaimer, the term of this patent is extended or adjusted under 35 U.S.C. 154(b) by 59 days.

(21) Appl. No.: 15/866,333

(22) Filed: Jan. 9, 2018

(65) Prior Publication Data
US 2019/0088230 A1    Mar. 21, 2019

(30) Foreign Application Priority Data
Sep. 15, 2017 (KR) .................. 10-2017-0118743

(51) Int. Cl.
*G09G 3/36* (2006.01)
*H03M 1/66* (2006.01)

(52) U.S. Cl.
CPC ......... *G09G 3/3696* (2013.01); *G09G 3/3614* (2013.01); *G09G 3/3648* (2013.01); *G09G 3/3685* (2013.01); *H03M 1/66* (2013.01); *G09G 2310/027* (2013.01)

(58) Field of Classification Search
CPC .. G09G 3/3696; G09G 3/3648; G09G 3/3614; G09G 3/3685; G09G 2310/027; H03M 1/66
See application file for complete search history.

(56) References Cited

U.S. PATENT DOCUMENTS

| | | | |
|---|---|---|---|
| 2010/0141639 A1* | 6/2010 | Baek | G09G 3/3685 345/213 |
| 2011/0018792 A1* | 1/2011 | Weng | G09G 3/3688 345/98 |
| 2011/0032245 A1* | 2/2011 | Inokuchi | G02F 1/1345 345/212 |
| 2012/0176391 A1* | 7/2012 | Woo | G09G 3/3688 345/549 |
| 2016/0098967 A1* | 4/2016 | Kwon | G09G 3/3614 345/211 |

* cited by examiner

*Primary Examiner* — Abhishek Sarma
(74) *Attorney, Agent, or Firm* — Andrew D. Fortney; Central California IP Group, P.C.

(57) ABSTRACT

A source driver is disclosed, including a data exchanger configured to receive a predetermined number of units of data and store the data corresponding to a predetermined number of channels, and a latch unit configured to store the data output from the data exchanger. The data exchanger mutually exchanges data corresponding to two channels included in each of a plurality of groups, and independently exchanges data for each of the plurality of groups, in which each of the plurality of groups includes two adjacent channels.

20 Claims, 4 Drawing Sheets

| H2DOT | (n+1)ch | (n+2)ch | (n+3)ch | (n+4)ch | (n+5)ch | (n+6)ch | (n+7)ch | (n+8)ch |
|---|---|---|---|---|---|---|---|---|
| H | + | - | - | + | + | - | - | + |

SOURCE DRIVER AND DISPLAY DEVICE INCLUDING THE SAME

This application claims the benefit of Korean Patent Application No. 10-2017-0118743, filed on Sep. 15, 2017, which is hereby incorporated by reference as if fully set forth herein.

BACKGROUND OF THE INVENTION

Field of the Invention

Embodiments of the present invention relate to a source driver and a display device including the same.

Discussion of the Related Art

In general, a display device (e.g., a liquid crystal display [LCD]) displays an image by adjusting an optical transmittance of liquid crystal cells using optical properties of liquid crystal, in which molecular arrangement is changed by an electric field. Typically, the display device includes a display panel and a source driver configured to supply data to the display panel.

Upon supplying data to be displayed to data lines of the display panel, an inversion method of exchanging data between adjacent channels, according to a polarity control signal may be used to prevent deterioration of the display panel. Since the source driver requires a multiplexer for exchange of data per channel, the size of an area in which each channel is formed may be increased, and thus, the size of a source driver chip may be increased.

In addition to using the inversion method to prevent deterioration of the channel, various methods may be implemented for exchanging data between adjacent channels. Furthermore, the source driver may perform various inversion methods requested by customers.

SUMMARY OF THE INVENTION

Accordingly, embodiments of the present invention are directed to a source driver and a display device including the same that substantially obviate one or more problems due to limitations and disadvantages of the related art.

An object of at least some embodiments is to provide a source driver capable of reducing a chip size and implementing various types of inversion patterns and a display device including the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with purpose(s) of the invention, as embodied and broadly described herein, a source driver includes (i) a data exchanger configured to receive a predetermined number of units of data and store data corresponding to a predetermined number of channels and (ii) a latch unit configured to store the data from the data exchanger, wherein the data exchanger mutually exchanges data corresponding to two channels in each of a plurality of groups, and independently exchanges data for each of the plurality of groups, in which each of the plurality of groups includes two adjacent channels.

The data exchanger may include (a) a plurality of storage units configured to receive the predetermined number of units of data and store the data corresponding to the predetermined number of channels and (b) switch units corresponding to the plurality of groups, wherein each of the switch units may mutually exchange and output data from two storage units corresponding to two channels in at least one of the plurality of groups.

The plurality of storage units may include first storage units configured to receive the predetermined number of units of data based on a first clock signal and second storage units configured to receive and store the data from the first storage units based on the first clock signal.

The switch units may include a plurality of inversion switches independently controlled by switch control signals, and each of the plurality of inversion switches may include first and second output terminals configured to receive first data from at least one of the first storage units and second data from at least one of the second storage units and to output the received first and second data.

Each of the plurality of inversion switches may output one of the received first and second data through the first output terminal and output the other of the received first and second data through the second output terminal, based on a corresponding one of the switch control signals.

Each of the switch units may include a third storage unit configured to store data from the first output terminal of each of the plurality of inversion switches based on a second clock signal and a fourth storage unit configured to store data from the second output terminal of each of the plurality of inversion switches based on the second clock signal.

Each of the switch units may further include one or more multiplexers corresponding to the plurality of inversion switches, and each of the multiplexers may selectively output one of the data from the third storage unit and the data from the fourth storage unit based on a selection signal.

The source driver may further include storage units configured to store the data from the multiplexers and to output the data to the latch unit, based on the first clock signal.

The source driver may further include a level shifter configured to shift a voltage level of the data from the latch unit, a digital-to-analog converter configured to convert the data from the level shifter into an analog signal, and an output unit configured to amplify the analog signal from the digital-to-analog converter and to output the amplified analog signal.

According to other embodiments of the present invention, a source driver may include first to sixth storage units configured to receive units of data (e.g., three units of data) and to sequentially store the received data, a first inversion switch configured to receive first data from the first storage unit and second data from the second storage unit, a second inversion switch configured to receive third data from the third storage unit and fourth data from the fourth storage unit, a third inversion switch configured to receive fifth data from the fifth storage unit and sixth data from the sixth storage unit, seventh and eighth storage units connected to the first inversion switch, ninth and tenth storage units connected to the second inversion switch, and eleventh and twelfth storage units connected to the third inversion switch, wherein the first inversion switch outputs the first data to one of the seventh and eighth storage units and outputs the second data to the other of the seventh and eighth storage units based on a first switch control signal, the second inversion switch outputs the third data to one of the ninth and tenth storage units and outputs the fourth data to the other of the ninth and tenth storage units based on a second switch control signal, and the third inversion switch outputs the fifth data to one of the eleventh and twelfth storage units and outputs the sixth data to the other of the eleventh and twelfth storage units based on a third switch control signal.

The first to third switch control signals may be independently controlled.

The first storage unit may receive and store the data from the fourth storage unit based on a first clock signal, the second storage unit may receive and store the data from the fifth storage unit based on the first clock signal, and the third storage unit may receive and store the data from the sixth storage unit based on the first clock signal.

Each of the seventh to twelfth storage units may store at least one of outputs of the first to fourth inversion switches based on a second clock signal.

The source driver may further include a first multiplexer configured to output the data from one of the seventh and eighth storage units based on a selection signal, a second multiplexer configured to output the data from one of the ninth and tenth storage units based on the selection signal, and a third multiplexer configured to output the data from one of the eleventh and twelfth storage units based on the selection signal.

The source driver may further include a thirteenth storage unit configured to receive and store the output of the first multiplexer, a fourteenth storage unit configured to receive and store the output of the second multiplexer, and a fifteenth storage unit configured to receive and store the output of the third multiplexer.

The source driver may further include a latch unit configured to sequentially store the data from the thirteenth to fifteenth storage units, a level shifter configured to shift a voltage level of the data from the latch unit, a digital-to-analog converter configured to convert the data from the level shifter into an analog signal, and an output unit configured to amplify the analog signal output from the digital-to-analog converter and to output the amplified analog signal.

The source driver may further include a data reception unit configured to supply at least three units of data to the fourth and sixth storage units.

The latch unit may include a first latch unit including a plurality of first latches and a second latch unit including a plurality of second latches, the first latches may sequentially sample the data from the thirteenth to fifteenth storage units and store the sampled data based on a first latch enable signal, and each of the second latches may store data from one of the first latches and output the stored data to the level shifter based on a second latch enable signal.

The first to third switch control signals and the first and second clock signals may be received from the data reception unit.

According to even further embodiments of the present invention, a display device includes a display panel including gate lines, data lines, pixels connected to the gate lines and the data lines, a source driver configured to drive the data lines, and a gate driver configured to drive the gate lines, wherein the pixels are in a matrix including rows and columns, and the source driver is the source driver according to at least one of the above-described embodiments.

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
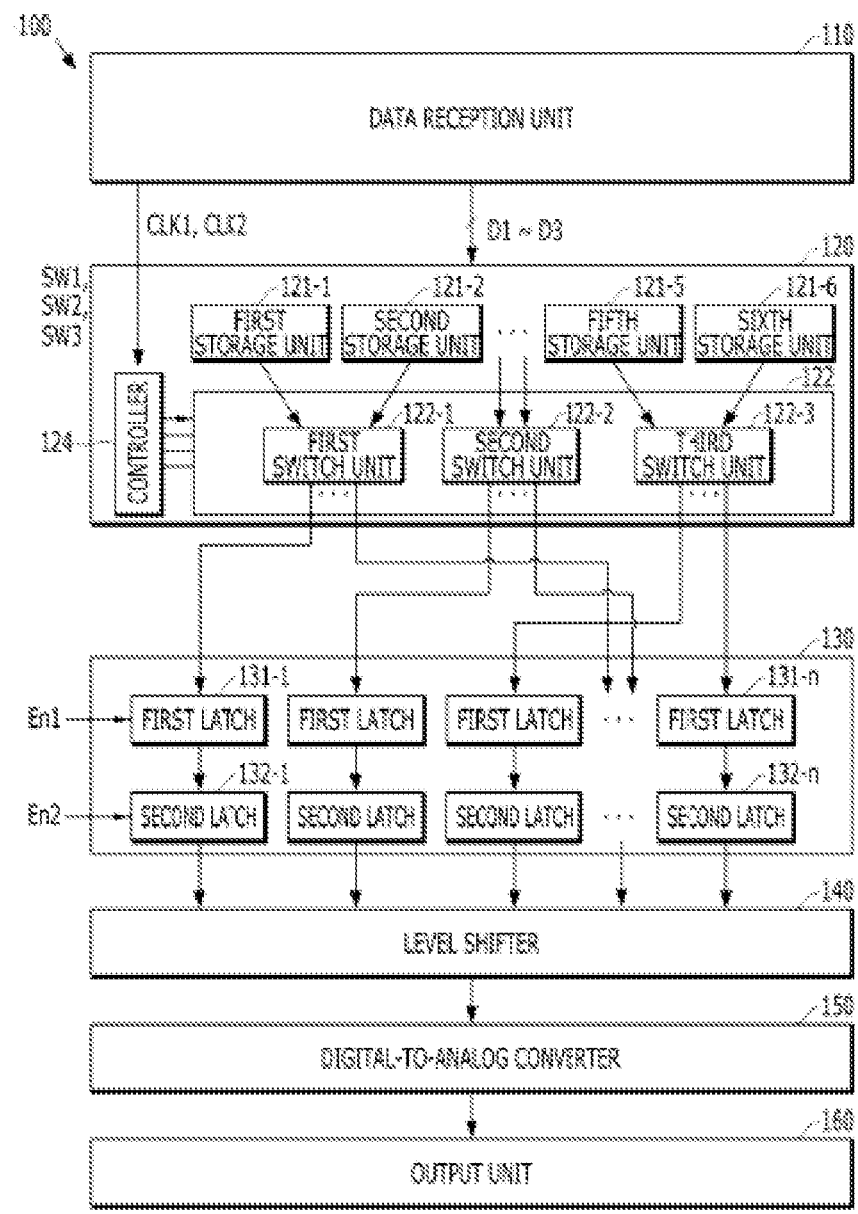
FIG. 1 is a diagram showing the configuration of an exemplary source driver according to one or more embodiments of the present invention.

Reference will now be made in detail to embodiments of the present invention, examples of which are illustrated in the accompanying drawings.

In the following description of the embodiments, it will be understood that, when an element is referred to as being "on" or "under" another element, it can be directly on or under another element or can be indirectly on or under the other element with intervening elements therebetween. Furthermore, when the expression "on" or "under" is used herein, it may include the upward direction and/or the downward direction with reference to one element.

In addition, it will be understood that relative terms used hereinafter, such as "first" and "second," "on"/"above"/"over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The terms "including", "comprising", "having" and variations thereof disclosed herein mean "including but not limited to" unless expressly specified otherwise, and, as such, should not be construed to exclude elements other than the elements disclosed herein and should be construed to further include additional elements. In addition, the terms "corresponding" and variations thereof disclosed herein may involve at least one of "facing," "overlapping" and "in a unique or predetermined relationship with."

FIG. 1 is a diagram showing the configuration of an exemplary source driver 100 according to one or more embodiments of the present invention.

Referring to FIG. 1, the source driver 100 may include a data reception unit 110, a data exchanger 120, a latch unit 130, a level shifter 140, a digital-to-analog converter 150, and an output unit 160.

The data reception unit 110 receives data (e.g., red, green and blue [RGB] image data) from a timing controller (not shown in FIG. 1, but which may be similar or identical to the timing controller 205 in FIG. 5) and stores the received data.

In addition, the data reception unit 110 may receive control signals, such as switch control signals SW1 to SW3, clock signals CLK1 and CLK2, and latch enable signals En1 and En2, from the timing controller (not shown), without being limited thereto.

The data exchanger 120 receives a predetermined units of data corresponding to a predetermined number of channels from the data reception unit 110 and stores the received data.

The channel may refer to a channel of a display panel or a data output line of a source driver.

For example, the data exchanger 120 may receive data corresponding to the predetermined number of channels from the data reception unit 110 and store the received data.

For example, the data exchanger 120 may receive six units of data corresponding to six channels from the data reception unit 110, in two sets of three units of data (e.g., R, G, B data), and may store the received six units of data.

The data exchanger 120 mutually exchanges data corresponding to at least two adjacent channels among the predetermined number of channels and outputs the exchanged data.

The data exchanger 120 may perform an inversion operation to independently and mutually exchange data with respect to a plurality of groups. For example, one of the plurality of groups may include two adjacent channels among the predetermined number of channels.

For example, the data exchanger 120 may exchange data corresponding to two channels in each of the plurality of groups among the data received and stored from the data reception unit 110. At this time, the data exchanger 120 may independently exchange data for the plurality of groups (e.g., each of the plurality of groups).

In addition, the data exchanger 120 may include an inversion unit 122 including a plurality of switch units (e.g., 122-1 to 122-3) configured to receive data from a plurality of storage units (e.g., 121-1 to 121-6). A controller 124 configured to receive control signals from the data reception unit 110 may supply the received control signals (e.g., SW1 to SW3, CLK and CLK2) to the inversion unit 122.

In another embodiment, the controller 124 may be separate from the data exchanger 120. In yet another embodiment, the controller 124 may be omitted, and the control signals may be directly supplied from the data reception unit 110 to the plurality of storage units (e.g., 121-1 to 121-6) and the plurality of switch units (e.g., 122-1 to 122-3).

For example, the data exchanger 120 may include first to sixth storage units 121-1 to 121-6 and first to third switch units 122-1 to 122-3, the numbers of which are not limited thereto.

The plurality of storage units (e.g., 121-1 to 121-6) may each receive the predetermined number of units of data and/or store data corresponding to the predetermined number of channels.

For example, the plurality of storage units (e.g., 121-1 to 121-6) may store data D1 to D3 received from the data reception unit 110 (e.g., three units of data).

Furthermore, the plurality of storage units may include (i) storage units 121-4 to 121-6 configured to receive the predetermined number of units of data based on a first clock signal CLK and (ii) storage units 121-1 to 121-3 configured to receive and store the data from the storage units 121-4 to 121-6 based on the first clock signal.

The plurality of switch units (e.g., 122-1 to 122-3) may correspond to the plurality of groups (e.g., the groups of channels).

Each of the plurality of switches (e.g., in the switch units 122-1 through 122-3) may mutually exchange and output the data from two storage units corresponding to two channels in at least one of the plurality of groups among the plurality of storage units and/or the plurality of channels.

Each of the plurality of switch units (e.g., 122-1 to 122-3) may or may not independently exchange the data of two adjacent storage units (e.g., 121-1 and 121-2, 121-3 and 121-4 or 121-5 and 121-6) among the plurality of storage units.

For example, each of the plurality of switch units (e.g., 122-1 to 122-3) may selectively exchange the data of at least a corresponding pair of storage units among the plurality of storage units (e.g., 121-1 and 121-2, 121-3 and 121-4 or 121-5 and 121-6).

Figure 2:
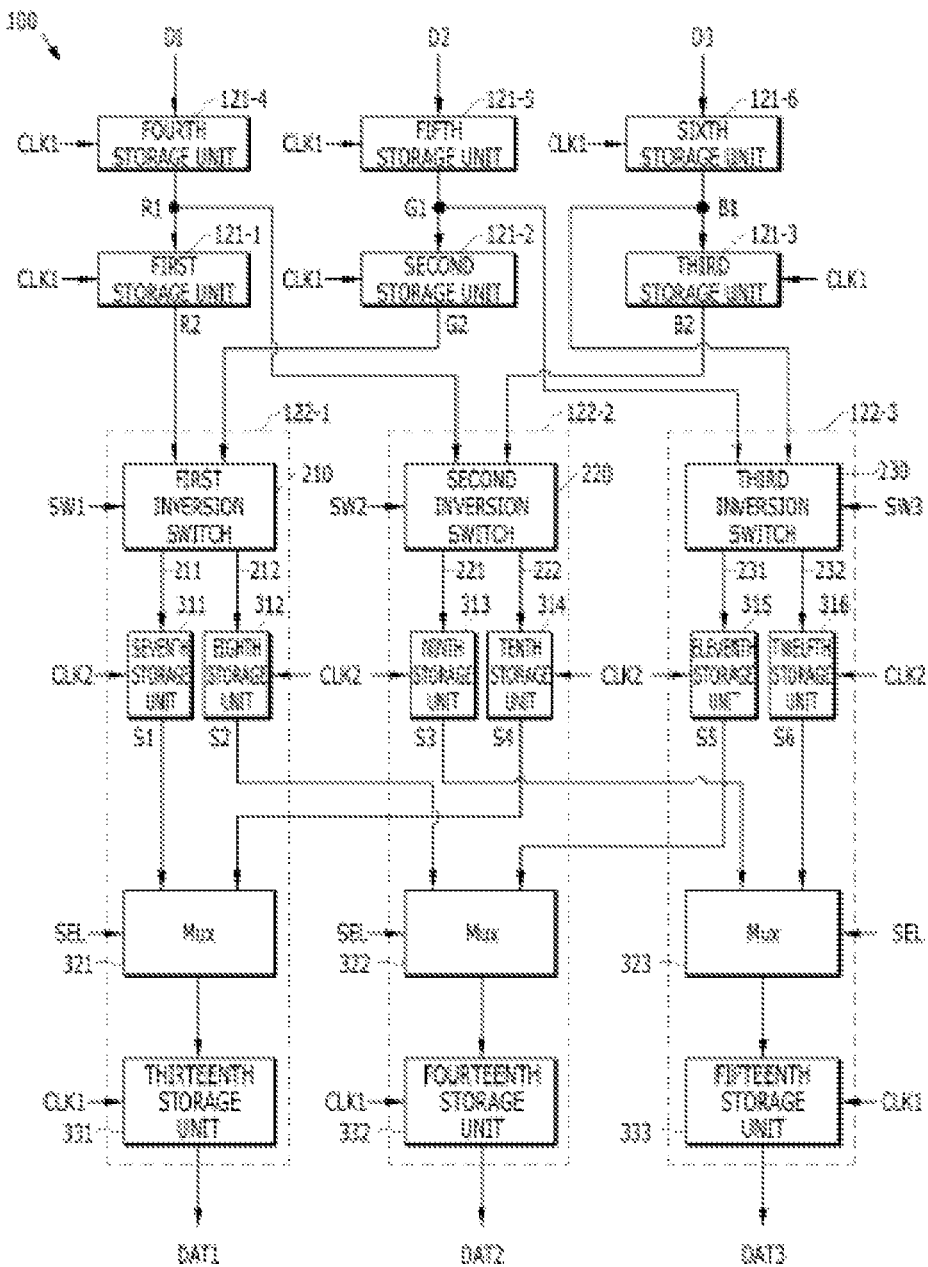
FIG. 2 is a diagram showing an exemplary embodiment of the data exchanger of FIG. 1.

FIG. 2 is a diagram showing an embodiment of the exemplary data exchanger 120 of FIG. 1.

Referring to FIG. 2, the data exchanger 120 may include first to sixth storage units 121-1 to 121-6, first to third inversion switches 210 to 230, seventh to twelfth storage units 311 to 316, first to third multiplexers 321 to 323, and thirteenth to fifteenth storage units 331 to 333.

In response to the first clock signal CLK1, the fourth to sixth storage units 121-4 to 121-6 may receive three units of data D1 to D3 from the data reception unit 110 and store the received data (e.g., as R1, G1, and B1, respectively).

In response to the first clock signal CLK, each of the first to third storage units 121-1 to 121-3 may receive and store the data from one of the fourth to sixth storage units 121-4 to 121-6.

For example, the data D1 from the data reception unit 110 may be stored in the fourth storage unit 121-4, then in the first storage unit 121-1, in response to successive identical transitions (e.g., rising or falling edges) or states (e.g., high or low) of the first clock signal CLK1.

For example, the first storage unit 121-1 may receive and store the data from the fourth storage unit 121-4 based on the first clock signal.

In addition, for example, the data D2 from the data reception unit 110 may be sequentially stored in the fifth storage unit 121-5, then in the second storage unit 121-2 in response to successive identical transitions or states of the first clock signal CLK1.

For example, the second storage unit 121-2 may receive and store the data from the fifth storage unit 121-5 based on the first clock signal.

In addition, for example, the data D3 from the data reception unit 110 may be sequentially stored in the sixth storage unit 121-6, then in the third storage unit 121-3 in response to successive identical transitions or states of the first clock signal CLK1.

For example, the third storage unit 121-3 may receive and store the data from the sixth storage unit 121-6 based on the first clock signal.

Each of the plurality of switch units (e.g., 122-1 to 122-3) may include an inversion switch 210, 220 or 230, a pair of third storage units 311 and 312, 313 and 314 or 315 and 316, a multiplexer 321, 322 or 323, and a fourth storage unit 331, 332, or 333.

The plurality of inversion switches 210 to 230 may be independently controlled by switch control signals SW1 to SW3.

Each of the plurality of inversion switches 210 to 230 may include first output terminals 211, 221 and 231 and second output terminals 212, 222 and 232 configured to provide data R2, G2 or B2 from one of the storage units 121-1 to 121-3 and/or data R1, G1 or B1 from one of the storage units 121-4 to 121-6.

Each of the plurality of inversion switches 210 to 230 may output one of the received data R2, G2 and B2 and/or one of the data R1, G1 or B1 through the first output terminal 211, 221 or 231, and another one of the received data R2, G2 and B2 and/or another one of the data R1, G1 or B1 through the second output terminal 212, 222 or 232, based on one of the switch control signals SW1 to SW3.

The storage units 311, 313 and 315 may store the data from the corresponding first output terminal 211, 221 or 231 of the inversion switches 210 to 230 based on the second clock signal CLK2, and the storage units 312, 314 and 316 may store the data from the corresponding second output terminal 212, 222 or 232 of the inversion switches 210 to 230 based on the second clock signal CLK2.

Each of the multiplexers 321, 322 and 323 may selectively output one of the data from the corresponding storage unit 311, 313 or 315 and the data from the corresponding storage unit 312, 314 or 316 based on a selection signal SEL.

The storage units 331 to 333 may store the data from the multiplexers 321, 322 and 323 and output the data to the latch unit 130, based on the first clock signal CLK1.

The first inversion switch 210 may receive the first data R2 from the first storage unit 121-1 and the second data G2 from the second storage unit 121-2, output the first data R2 through one of the first and second output terminals 211 and 212, and output the second data G2 through the other of the first and second output terminals 211 and 212, based on the first switch control signal SW1.

The second inversion switch 220 may receive the third data B2 from the third storage unit 121-3 and the fourth data R1 from the fourth storage unit 121-4, output the third data B2 through one of the third and fourth output terminals 221 and 222 and output the fourth data R1 through the other of the third and fourth output terminals 221 and 222 based on the second switch control signal SW2.

The third inversion switch 230 may receive the fifth data G1 from the fifth storage unit 121-5 and the sixth data B1 from the sixth storage unit 121-6, output the fifth data G1 through one of the fifth and sixth output terminals 231 and 232 and output the sixth data B1 through the other of the fifth and sixth output terminals 231 and 231 based on the third switch control signal SW3.

The seventh to twelfth storage units 311 to 316 may store the data on a corresponding one of the first to sixth output terminals 211, 212, 221, 222, 231 and 232 based on the second clock signal CLK2. For example, the period of the second clock signal CLK2 may be greater than that of the first clock signal CLK1. Alternatively, the frequency of the first clock signal CLK1 may be greater than that of the second clock signal CLK2.

For example, the seventh storage unit 311 may store the data on the first output terminal 211 of the first inversion switch 210 based on the second clock signal CLK.

The eighth storage unit 312 may store the data on the second output terminal 212 of the first inversion switch 210 based on the second clock signal CLK.

In addition, the ninth storage unit 313 may store the data on the third output terminal 221 of the second inversion switch 220 based on the second clock signal CLK.

Furthermore, the tenth storage unit 314 may store the data on the fourth output terminal 222 of the second inversion switch 220 based on the second clock signal CLK.

The eleventh storage unit 315 may store the data on the fifth output terminal 231 of the third inversion switch 230 based on the second clock signal CLK.

Also, the twelfth storage unit 316 may store the data on the sixth output terminal 232 of the third inversion switch 230 based on the second clock signal CLK.

Each of the first to third multiplexers 321 to 323 may output one of the odd-numbered data S1, S3 and S5 and one of the even-numbered data S2, S4 and S6 based on a selection control signal SEL.

Here, the odd-numbered data may be stored in the odd-numbered storage units 311, 313 and 315 of the seventh to twelfth storage units 311 to 316. The even-numbered data may be stored in the even-numbered storage units 312, 314 and 316 of the seventh to twelfth storage units 311 to 316.

For example, the first multiplexer 321 may output one of the data S1 from the seventh storage unit 311 and the data S4 from the tenth storage unit 314 based on the selection signal SEL.

The second multiplexer 322 may output one of the data S2 from the eighth storage unit 312 and the data S5 from the eleventh storage unit 311 based on the selection signal SEL.

The third multiplexer may output one of the data S3 from the ninth storage unit 313 and the data S6 from the twelfth storage unit 316 based on the selection signal SEL.

The thirteenth to fifteenth storage units 331 to 333 may store the data output from one of the first to third multiplexers 331 to 333 based on the first clock signal CLK1.

Although the first to fifteenth storage units 121-1 to 121-6, 311 to 316 and 331 to 333 may comprise one or more flip-flops (e.g., latches), the present invention is not limited thereto, and any component for performing the function of the data storage unit may be used.

The latch unit 130 may store the data from the data exchanger 120.

The latch unit 130 may include a first latch unit 131-1 through 131-$n$ and a second latch unit 132-1 through 132-$n$.

The first latch unit 131-1 through 131-$n$ may store the data DAT1 to DAT3 from the thirteenth to fifteenth storage units 331 to 333 based on a first latch enable signal En1.

For example, the first latch unit 131 may include a plurality of first latches 131-1 to 131-$n$ (n being a natural number greater than 1, and in one example, a multiple of 3), and the plurality of first latches 131-1 to 131-$n$ may sample the data DAT1 to DAT3 from the thirteenth to fifteenth storage units 331 to 333 and store the sampled data, based on the first latch enable signal En1.

The second latch unit 132 may receive and store the data from the plurality of first latches 131-1 to 131-$n$ based on a second latch enable signal En2.

The second latch unit 132 may include a plurality of second latches 131-2 to 132-$n$ (n being a natural number greater than 1) corresponding to the plurality of latches 131-1 to 131-$n$ (n being a natural number greater than 1).

Each of the plurality of second latches 131-2 to 132-$n$ (n being a natural number greater than 1) may latch or store the data from a corresponding one of the plurality of first latches 131-1 to 131-$n$ and output the stored data to the level shifter 140 based on a second latch enable signal En2.

The first and second latch enable signals En1 and En2 may be received from the controller 124 or the timing controller 205.

The level shifter 140 shifts the voltage level of the data received from the second latch unit 132. For example, the level shifter 140 may change (e.g., increase) the voltage of the data from the second latch unit 132 from a first voltage level to a second voltage level.

For example, the level shifter 140 may include a plurality of level shifters corresponding to the second latches 132-1 to 132-$n$. The number of level shifters may be equal to the number of first latches and/or the number of second latches, without being limited thereto.

The digital-to-analog converter 150 may convert the output of the level shifter 140 (e.g., digital data) into an analog signal.

For example, the digital-to-analog converter 150 may receive grayscale voltages from a power supply (not shown) and convert the output of the level shifter 140 into an analog signal.

For example, the power supply (not shown) may comprise a plurality of resistors connected in series between a supply voltage source VDD2 and a ground voltage source GND to generate a plurality of grayscale voltages (e.g., 256 different voltages).

The output unit 160 amplifies (or buffers) the analog signal from the digital-to-analog converter 150 and outputs an amplified (or buffered) analog signal.

The output unit 160 may include a plurality of amplifiers and/or a plurality of buffers.

The plurality of amplifiers and/or buffers of the output unit 160 may correspond to the channels or data lines of the display panel, and may supply a drive signal as an analog signal to the corresponding channels or data lines.

Figures 3, 4:
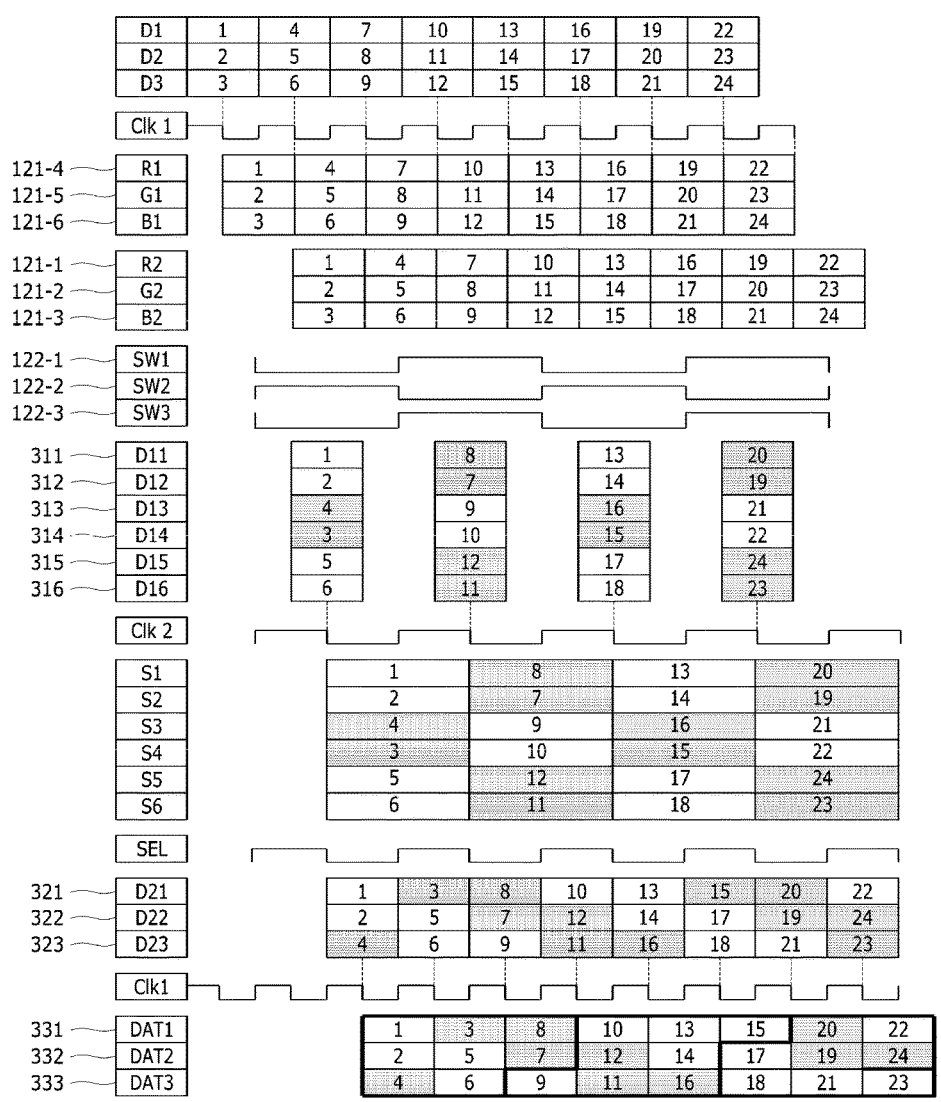
FIG. 3 is a diagram showing an exemplary predetermined inversion pattern of a display panel.
FIG. 4 is a timing diagram showing an exemplary operation of the data exchanger of FIG. 1.

FIG. 3 is a diagram showing an exemplary predetermined inversion pattern of a display panel, and FIG. 4 is a timing diagram showing an exemplary operation of the data exchanger of FIG. 1.

Referring to FIGS. 3 and 4, a horizontal dot inversion method for preventing deterioration of the display panel may be implemented, in which positive polarity (+) and negative polarity (−) driving may be alternately repeated in a horizontal direction with respect to adjacent channels or pairs of channels of the display panel.

In FIG. 3, with respect to eight adjacent channels (n+1)ch to (n+8)ch implementing alternating positive and negative polarity, a predetermined inversion pattern may have an order of positive polarity (+), negative polarity (−), negative polarity (−), positive polarity (+), positive polarity (+), negative polarity (−), negative polarity (−), and positive polarity (+).

The predetermined inversion pattern is designed, such that driving the third channel (n+3)ch and driving the fourth channel (n+4)ch are mutually exchanged, and driving the seventh channel (n+7)ch and driving the eighth channel (n+8)ch are mutually exchanged.

In order to implement such a predetermined inversion pattern, the data exchanger 120 may mutually exchange the data for driving the third channel (n+3)ch and the fourth channel (n+4)ch, as well as for driving the seventh channel (n+7)ch and the eighth channel (n+8)ch among the eight adjacent channels and perform data exchange with respect to the other channels.

Referring to FIG. 4, when the switch control signals SW1, SW2 and SW3 have a first level (e.g., a high level), the first to third inversion switches 122-1 to 122-3 may perform data exchange according to the inversion operation, and output data to two storage units of the seventh to twelfth storage units 311 to 316, according to the data exchange.

In contrast, when the switch control signals SW1, SW2 and SW3 have a second level (e.g., a low level), the first to third inversion switches 122-1 to 122-3 may not perform data exchange according to the inversion operation, and thus output data to two storage units of the seventh to twelfth storage units 311 to 316.

For example, the third data B2 for the third channel and the fourth data R1 for the fourth channel may be mutually exchanged, and the seventh data R2 for the seventh channel and the eighth data G2 for the eighth channel may be mutually exchanged.

The first multiplexer 321 may select and output one of the first data S1 and the fourth data S4 based on the selection signal SEL.

The second multiplexer 322 may select and output one of the second data S2 and the fifth data S5 based on the selection signal SEL.

The third multiplexer 323 may select and output one of the third data S3 and the sixth data S6 based on the selection signal SEL.

The thirteenth to fifteenth storage units 331 to 333 may store the data output from one of the first to third multiplexers 321 to 323 and output the stored data DAT1, DAT2 and DAT3 based on the first clock signal CLK1.

The source driver 100 according to various embodiments may control data inversion on data or signals provided to the display panel to suit the predetermined inversion pattern for the display panel.

In general, the multiplexers corresponding to the channels may be required for data inversion. However, in various embodiments, a predetermined number (e.g., three) of multiplexers may be provided in the data exchanger 120 to perform data inversion, thereby reducing a chip size.

In addition, the inversion pattern may be variously changed according to the type of the display panel or the request of the customer. In the embodiment(s) of FIGS. 1-4, the first to third inversion switches 210 to 230 are individually controlled based on the switch control signals SW1 to SW3, thereby implementing various types of inversion patterns.

Figure 5:
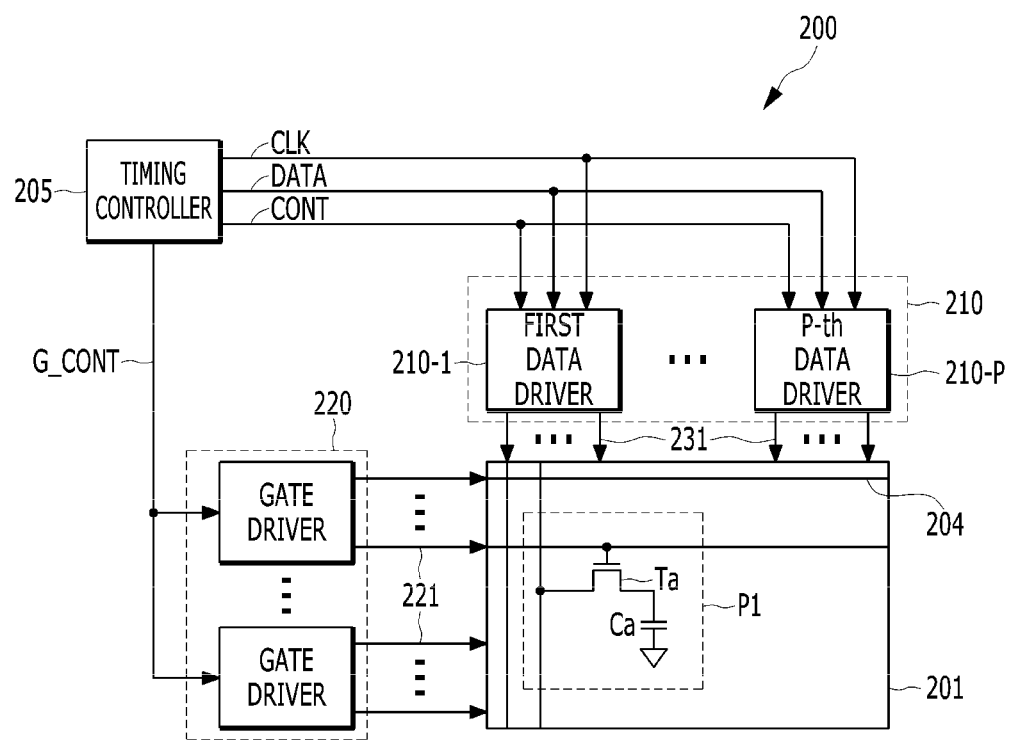
FIG. 5 is a diagram showing an exemplary display device according to one or more embodiments of the present invention.

FIG. 5 is a diagram showing an exemplary display device 200 according to one or more embodiments of the present invention.

Referring to FIG. 5, the display device 200 includes a display panel 201, a timing controller 205, a source driver unit 210 and a gate driver unit 220.

The display panel 201 includes (i) gate lines 221 forming rows and (ii) data lines 231 forming columns, both of which cross each other to form a matrix, and pixels connected to the gate lines and data lines at the intersections thereof.

The pixels may be connected to the gate lines 221 and the data lines 231, and may be in a matrix of rows and columns.

Each pixel may include (i) a transistor Ta connected to the gate line and the data line and (ii) a capacitor Ca connected to the transistor Ta.

For example, each pixel may include a R (Red) sub-pixel, a G (Green) sub-pixel, and a B (Blue) sub-pixel, and each of the R, G, and B sub-pixels may include a transistor Ta connected to the gate line and the data line and a capacitor Ca connected to the transistor Ta.

The timing controller 205 outputs a clock signal CLK, the data DATA, a first control signal CONT for controlling the source driver 210, and a second control signal G_CONT for controlling the gate driver 220.

Although the clock signal CLK, the data DATA, and the first control signal CONT are transmitted to the drivers 210-1 to 210-P on three transmission lines in FIG. 5, the present invention is not limited thereto. In other embodiments, the clock signal CLK, the data DATA, and the first control signal CONT may be time-divisionally transmitted to the drivers 210-1 to 210-P on one transmission line.

For example, the first control signal CONT may include a horizontal start signal, an enable signal En and a clock signal CLK input to the data reception unit (e.g., a shift register) 110 (see, e.g., FIG. 1). The second control signal G_CONT may include a gate drive signal for driving the gate lines 221.

The gate driver unit 220 may drive the gate lines 221, and include a plurality of gate drivers that output gate drive signals on the gate lines 221 for controlling the transistors Ta of the pixels.

The source driver unit 210 may drive the data lines or the channels 231 of the display panel and include a plurality of source drivers 210-1 to 210-P (P being a natural number greater than 1).

Each of the source drivers 210-1 to 210-P (P being a natural number greater than 1) may be similar or identical to the source driver 100 of FIG. 1.

Embodiments may reduce a chip size and implement various types of inversion patterns.

Characteristics, structures, effects, and so on described in various embodiments are included in at least one of the embodiments of the present invention, but are not limited to only one embodiment invariably. Furthermore, it is apparent that the features, the structures, the effects, and so on described in the embodiments can be combined or modified with other embodiments by persons skilled in the art. Therefore, it should be understood that the contents relevant to such combination and modification fall within the scope of the present invention.

What is claimed is:

1. A source driver comprising:
   a data exchanger configured to receive a predetermined number of units of data and store the data corresponding to a predetermined number of channels; and
   a latch unit configured to store the data from the data exchanger,
   wherein the data exchanger mutually exchanges data corresponding to two channels in each of a plurality of groups, and independently exchanges data for each of the plurality of groups, in which each of the plurality of groups includes two adjacent channels.

2. The source driver according to claim 1, wherein the data exchanger includes:
   a plurality of storage units configured to receive and store the predetermined number of units of data; and
   switch units corresponding to the plurality of groups,
   wherein each of the switch units mutually exchanges and outputs data from two storage units corresponding to two channels in one of the plurality of groups.

3. The source driver according to claim 2, wherein the plurality of storage units includes:
   first storage units configured to receive the predetermined number of units of data based on a first clock signal; and
   second storage units configured to receive and store the data from the first storage units based on the first clock signal.

4. The source driver according to claim 3, wherein the switch units include a plurality of inversion switches independently controlled by switch control signals, and
   each of the plurality of inversion switches includes first and second output terminals configured to provide first data from one of the first storage units and second data from one of the second storage units.

5. The according to claim 4, wherein each of the plurality of inversion switches outputs one of the first and second data on the first output terminal and outputs the other of the first and second data on the second output terminal, based on one of the switch control signals.

6. The source driver according to claim 4, wherein each of the switch units includes:
   a third storage unit configured to store data from the first output terminal of each of the plurality of inversion switches based on a second clock signal; and
   a fourth storage unit configured to store data from the second output terminal of each of the plurality of inversion switches based on the second clock signal.

7. The source driver according to claim 6,
   wherein each of the switch units further includes multiplexers corresponding to the plurality of inversion switches, and
   wherein each of the multiplexers selectively outputs one of the data from the third storage unit and the data from the fourth storage unit based on a selection signal.

8. The source driver according to claim 7, further comprising storage units configured to store the data from the multiplexers and to output the data to the latch unit based on the first clock signal.

9. The source driver according to claim 1, further comprising:
   a level shifter configured to shift a voltage level of the data from the latch unit;
   a digital-to-analog converter configured to convert the data from the level shifter into an analog signal; and
   an output unit configured to amplify the analog signal from the digital-to-analog converter and to output the amplified analog signal.

10. A source driver comprising:
    first to sixth storage units configured to receive and store increments of three units;
    a first inversion switch configured to receive first data from the first storage unit and second data from the second storage unit;
    a second inversion switch configured to receive third data from the third storage unit and fourth data from the fourth storage unit;
    a third inversion switch configured to receive fifth data from the fifth storage unit and sixth data from the sixth storage unit;
    seventh and eighth storage units connected to the first inversion switch;
    ninth and tenth storage units connected to the second inversion switch; and
    eleventh and twelfth storage units connected to the third inversion switch,
    wherein the first inversion switch outputs the first data to one of the seventh and eighth storage units and outputs the second data to the other of the seventh and eighth storage units based on a first switch control signal,
    wherein the second inversion switch outputs the third data to one of the ninth and tenth storage units and outputs the fourth data to the other of the ninth and tenth storage units based on a second switch control signal, and
    wherein the third inversion switch outputs the fifth data to one of the eleventh and twelfth storage units and outputs the sixth data to the other of the eleventh and twelfth storage units based on a third switch control signal.

11. The source driver according to claim 10, wherein the first to third switch control signals are independently controlled.

12. The source driver according to claim 10, wherein
    the first storage unit receives and stores the data from the fourth storage unit based on a first clock signal, the second storage unit receives and stores the data from the fifth storage unit based on the first clock signal, and wherein the third storage unit receives and stores the data from the sixth storage unit based on the first clock signal.

13. The source driver according to claim 10, wherein each of the seventh to twelfth storage units stores one of outputs of the first to fourth inversion switches based on a second clock signal.

14. The source driver according to claim 10, further comprising:
   a first multiplexer configured to output the data from one of the seventh and eighth storage units based on a selection signal;
   a second multiplexer configured to output the data from one of the ninth and tenth storage units based on the selection signal; and
   a third multiplexer configured to output the data from one of the eleventh and twelfth storage units based on the selection signal.

15. The source driver according to claim 14, further comprising:
   a thirteenth storage unit configured to receive and store an output of the first multiplexer;
   a fourteenth storage unit configured to receive and store an output of the second multiplexer; and
   a fifteenth storage unit configured to receive and store an output of the third multiplexer.

16. The source driver according to claim 15, further comprising:
   a latch unit configured to store the data from the thirteenth to fifteenth storage units;
   a level shifter configured to shift a voltage level of the data from the latch unit;
   a digital-to-analog converter configured to convert the data from the level shifter into an analog signal; and
   an output unit configured to amplify the analog signal from the digital-to-analog converter and to output the amplified analog signal.

17. The source driver according to claim 12, further comprising a data reception unit configured to supply the three units of data to the fourth and sixth storage units.

18. The source driver according to claim 16, wherein the latch unit includes:
   a first latch unit including a plurality of first latches; and
   a second latch unit including a plurality of second latches, wherein the first latches sample the data from the thirteenth to fifteenth storage units and store the sampled data based on a first latch enable signal, and
   each of the second latches stores data from one of the first latches and outputs the stored data to the level shifter based on a second latch enable signal.

19. The source driver according to claim 17, wherein the data reception unit provides the first to third switch control signals and the first and second clock signals.

20. A display device comprising:
   a display panel including gate lines, data lines and pixels connected to the gate lines and the data lines and in a matrix including rows and columns;
   the source driver of claim 1, configured to drive the data lines; and
   a gate driver configured to drive the gate lines.

* * * * *